(12) United States Patent
Yang (10) Patent No.: US 9,430,270 B2
(45) Date of Patent: Aug. 30, 2016

(54) SYSTEMS AND METHODS FOR MULTIPLE SENSOR NOISE PREDICTIVE FILTERING

(71) Applicant: LSI Corporation, San Jose, CA (US)

(72) Inventor: Shaohua Yang, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 481 days.

(21) Appl. No.: 14/025,409

(22) Filed: Sep. 12, 2013

(65) Prior Publication Data

US 2015/0067685 A1 Mar. 5, 2015

Related U.S. Application Data (60) Provisional application No. 61/871,437, filed on Aug. 29, 2013.

(51) Int. Cl.

| | |
|---|---|
| *G11B 5/035* | (2006.01) |
| *G06F 9/46* | (2006.01) |
| *H03M 13/00* | (2006.01) |
| *G11B 20/10* | (2006.01) |
| *G11B 5/09* | (2006.01) |
| *H04L 1/00* | (2006.01) |
| *H03M 13/11* | (2006.01) |
| *H03M 13/15* | (2006.01) |
| *H03M 13/41* | (2006.01) |

(52) U.S. Cl.
CPC ............ *G06F 9/46* (2013.01); *H03M 13/6331* (2013.01); *H03M 13/6343* (2013.01); *G11B 5/035* (2013.01); *G11B 5/09* (2013.01); *G11B 20/10009* (2013.01); *H03M 13/1102* (2013.01); *H03M 13/1515* (2013.01); *H03M 13/41* (2013.01); *H04L 1/005* (2013.01)

(58) Field of Classification Search
None
See application file for complete search history.

(56) References Cited

U.S. PATENT DOCUMENTS

| | | | | |
|---|---|---|---|---|
| 9,183,877 | B1 * | 11/2015 | Chen ................ | G11B 20/10481 |
| 9,252,989 | B2 * | 2/2016 | Lu ..................... | H04L 25/03038 |
| 2005/0268211 | A1 * | 12/2005 | Haratsch ........... | H04L 25/03235 |
| | | | | 714/796 |
| 2008/0198490 | A1 | 8/2008 | Wu et al. | |
| 2008/0304558 | A1 | 12/2008 | Zhu et al. | |
| 2010/0229031 | A1 * | 9/2010 | Tan .................... | G11B 20/1803 |
| | | | | 714/6.12 |
| 2010/0281347 | A1 | 11/2010 | Derras | |
| 2010/0322359 | A1 * | 12/2010 | Stockmanns .... | G11B 20/10296 |
| | | | | 375/341 |
| 2011/0167246 | A1 | 7/2011 | Yang et al. | |
| 2012/0084336 | A1 * | 4/2012 | Yang ................ | G11B 20/10046 |
| | | | | 708/323 |
| 2012/0089657 | A1 * | 4/2012 | Yang ................ | H04L 25/03993 |
| | | | | 708/323 |
| 2013/0077186 | A1 * | 3/2013 | Xia ........................ | G11B 5/09 |
| | | | | 360/32 |
| 2013/0170063 | A1 * | 7/2013 | Yang ................ | G11B 20/10046 |
| | | | | 360/53 |
| 2014/0063637 | A1 * | 3/2014 | Pan .................... | H03M 13/1102 |
| | | | | 360/65 |
| 2014/0233129 | A1 * | 8/2014 | Xiao ................ | G11B 20/10046 |
| | | | | 360/39 |
| 2014/0233130 | A1 * | 8/2014 | Mathew ............. | H04B 17/345 |
| | | | | 360/39 |

OTHER PUBLICATIONS

U.S. Appl. No. 14/025,409, filed Sep. 12, 2013, Yang, Shaohua.

* cited by examiner

*Primary Examiner* — Tan X Dinh (57) ABSTRACT

The present invention is related to systems and methods for branch metric calculation based on multiple data streams in a data processing circuit.

20 Claims, 6 Drawing Sheets

SYSTEMS AND METHODS FOR MULTIPLE SENSOR NOISE PREDICTIVE FILTERING

CROSS REFERENCE TO RELATED APPLICATIONS

The present application claims priority to (is a nonprovisional of) U.S. Pat. App. No. 61/871,437 entitled "Systems and Methods for Multiple Sensor Noise Predictive Filtering", and filed Aug. 29, 2013 by Yang. The entirety of the aforementioned provisional patent application is incorporated herein by reference for all purposes.

BACKGROUND OF THE INVENTION

The present invention is related to systems and methods for branch metric calculation based on multiple data streams in a data processing circuit.

Various data transfer systems have been developed including storage systems where data is transferred to and from a storage medium. The effectiveness of any transfer is impacted by noise arising in the data transfer, and the ability to accurately sense the data on the storage medium. To improve accuracy, multiple sensors may be used to sense the data on the storage medium. Each of the streams is processed and a result is derived. However, in some cases, the result derived from multiple streams is inaccurate do to an inability to adequately noise filter.

Hence, for at least the aforementioned reasons, there exists a need in the art for advanced systems and methods for data processing.

BRIEF SUMMARY OF THE INVENTION

The present invention is related to systems and methods for branch metric calculation based on multiple data streams in a data processing circuit.

Various embodiments of the present invention provide data processing systems that include: a first multi-stream noise predictive filter circuit operable to generate a first interim output corresponding to a first data input based upon a non-matrix based combination of the first data input and a previous instance of a second data input; a second multistream noise predictive filter circuit operable to generate a second interim output corresponding to the second data input based upon a non-matrix based combination of the second data input and a previous instance of the first data input; and a combining circuit operable to combine at least the first interim output with the second interim output to yield a combination branch metric.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sublabel, it is intended to refer to all such multiple similar components.

DETAILED DESCRIPTION OF THE INVENTION

The present invention is related to systems and methods for performing data processing, and more specifically to systems and methods for adaptive parameter modification in a data processing system.

Various embodiments of the present invention provide data processing circuits that include a data detector circuit and a data decoder circuit. The data detector circuit includes one or more multiple stream noise prediction circuits as part of the data detector circuit. A detected output from the data detector circuit is provided to the data decoder circuit that applies a data decode algorithm in an attempt to recover an originally written data set. Where application of the data decode algorithm yields the originally written data set, the decoded output is said to have "converged". In some cases, such convergence is indicated by satisfaction of all parity check equations relied upon in the data decode algorithm. Based upon the disclosure provided herein, one of ordinary skill in the art will recognize a variety of scenarios in which the decoded output is considered to have converged. Such a converged data set is provided as an output from the data processing circuit. A pass through both the data detector circuit and the data decoder circuit is referred to herein as a "global iteration". In some cases, the data processing circuit is designed to allow multiple global iterations. In various cases, the data decoding circuit may apply the data decode algorithm to the detected output multiple times during a given global iteration. In such cases, each application of the data decode algorithm is referred to herein as a "local iteration".

Various embodiments of the present invention provide data processing systems that include: a first multi-stream noise predictive filter circuit operable to generate a first interim output corresponding to a first data input based upon a non-matrix based combination of the first data input and a previous instance of a second data input; a second multistream noise predictive filter circuit operable to generate a second interim output corresponding to the second data input based upon a non-matrix based combination of the second data input and a previous instance of the first data input; and a combining circuit operable to combine at least the first interim output with the second interim output to yield a combination branch metric.

In some instances of the aforementioned embodiments, the systems further include a data detector circuit including the first multi-stream noise predictive filter circuit and the second multi-stream noise predictive filter circuit, and operable to provide a detected output corresponding to the first data input and the second data input based at least in part on the combination branch metric. In some cases, the system further includes a data decoder circuit operable to apply a data decode algorithm to the detected output to recover an original data set corresponding to the first data input and the second data input. In one particular case, the data decode algorithm is a low density parity check algorithm. In some cases, the data detector circuit applies a Viterbi algorithm data detection.

In one or more instances of the aforementioned embodiments, operation of the first multi-stream noise predictive filter circuit is based at least in part on a first coefficient set, and operation of the second multi-stream noise predictive filter circuit is based at least in part on a second coefficient set. In such instances, the systems further include a calibration circuit operable to: generate the first coefficient set based upon a difference between the first data input and an ideal first data input, and generate the second coefficient set based upon a difference between the second data input and an ideal second data input. In various instances of the aforementioned embodiment, the combining circuit is a summation circuit operable to sum the first interim output with at least the second interim output to yield the combination branch metric. In some instances of the aforementioned embodiments, generating the first interim output is done using a first linear computation, and generating the second interim output is done using a second linear computation.

In various instances of the aforementioned embodiments, the data processing system is implemented as part of a storage device including a storage medium. The storage medium includes at least a first track and a second track. A combination of the first data input and the second data input may be a first data input and a second data input derived from the first track, or a first data input derived from the first track and the second data input derived from the second track where the branch metric label involves bit combinations from multiple tracks for joint detection. In some instances of the aforementioned embodiments, the data processing system is implemented as part of a storage device including a storage medium. The storage medium includes tracks. The first data input corresponds to a first sample location along a particular one of the tracks, the second data input corresponds to a second sample location along the particular one of the tracks, and the first sample location and the second sample location are sampled at the same sample time.

Other embodiments of the present invention provide methods that include: generating a first interim output corresponding to a first data input using a first multi-stream noise predictive filter circuit based upon a non-matrix based combination of the first data input and a previous instance of a second data input; generating a second interim output corresponding to a second data input using a second multi-stream noise predictive filter circuit based upon a non-matrix based combination of the first data input and a previous instance of a second data input; and summing the first interim output with at least the second interim output to yield a combination branch metric.

Yet other embodiments of the present invention provide storage devices that include: a storage medium; a head assembly disposed in relation to the storage medium and operable to provide a first sensed signal and a second sensed signal corresponding to information along a track of the storage medium; and a read channel circuit. The read channel circuit includes: an analog front end circuit operable to provide a first analog signal corresponding to the first sensed signal, and a second analog signal corresponding to the second sensed signal; an analog to digital converter circuit operable to sample the first analog signal to yield a first series of digital samples, and sample the second analog signal to yield a second series of digital samples; an equalizer circuit operable to equalize the first series of digital samples to yield a first sample set, and equalize the second series of digital samples to yield a second sample set; and a data detector circuit. The data detector circuit includes: a first multi-stream noise predictive filter circuit operable to generate a first interim output corresponding to the first sample set based upon a non-matrix based combination of the first sample set and corresponding previous instances of the second sample set; a second multi-stream noise predictive filter circuit operable to generate a second interim output corresponding to the second sample set based upon a non-matrix based combination of the first sample set and corresponding previous instances of the second sample set; a combining circuit operable to combine at least the first interim output with the second interim output to yield a combination branch metric; and the data detector circuit is operable to provide a detected output corresponding to the first data input and the second data input based at least in part on the combination branch metric.

Figure 1A:
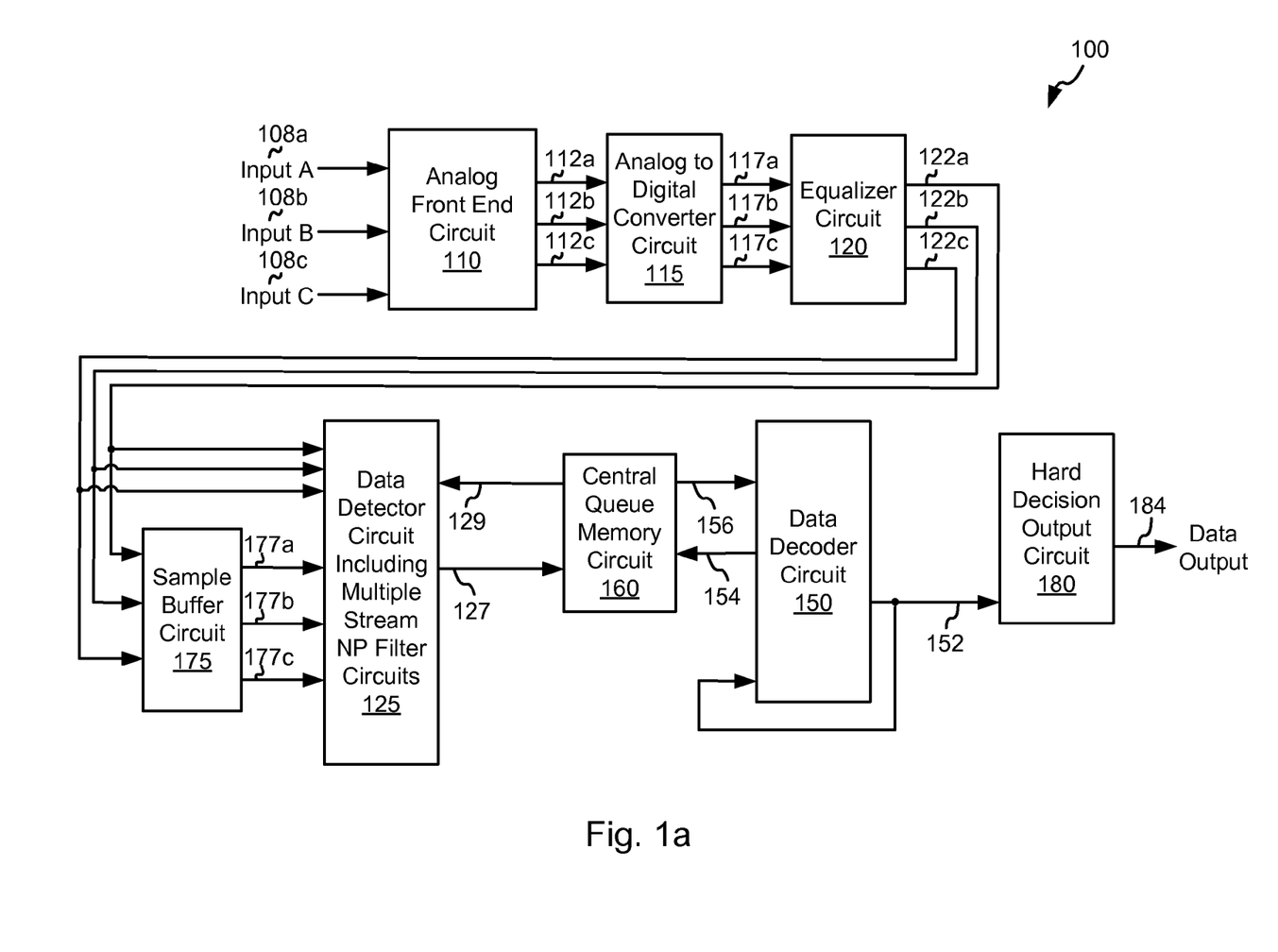
FIG. 1a-1d depicts a data processing circuit having multiple stream noise filtering circuitry in accordance with some embodiments of the present invention.

Turning to FIG. 1a, a data processing circuit 100 having a data detector circuit 125 with multiple stream noise predictive filter circuits is shown in accordance with some embodiments of the present invention. Data processing circuit 100 includes an analog front end circuit 110 that receives three different analog inputs (i.e., analog input 108a, analog input 108b, analog input 108c). Analog front end circuit 110 processes each of analog input 108a, analog input 108b, and analog input 108c to yield respective processed analog signals (i.e., processed analog signal 112a, processed analog signal 112b, processed analog signal 112c) which are provided to an analog to digital converter circuit 115. Analog front end circuit 110 may include, but is not limited to, three parallel analog filters and three parallel amplifier circuits as are known in the art. Based upon the disclosure provided herein, one of ordinary skill in the art will recognize a variety of circuitry that may be included as part of analog front end circuit 110. In some cases, analog input 108a is derived from a first sensor of a read/write head assembly (not shown), analog input 108b is derived from a second sensor of the read/write head assembly, and the analog input 108c is derived from a third sensor of the read/write head assembly. The read/write head assembly is disposed in relation to a storage medium (not shown).

Analog to digital converter circuit 115 converts processed analog signal 112a into a first series of digital samples 117a, processed analog signal 112b into a second series of digital samples 117b, and processed analog signal 112c into a third series of digital samples 117c. Analog to digital converter circuit 115 may be any circuit known in the art that is capable of producing digital samples corresponding to an analog input signal. In one particular embodiment of the present invention, analog to digital converter circuit 115 has three parallel converter circuits each processing a respective one of digital samples 117a, digital samples 117b, and digital samples 117c. Based upon the disclosure provided herein, one of ordinary skill in the art will recognize a variety of analog to digital converter circuits that may be used in relation to different embodiments of the present invention. Digital samples 117a, digital samples 117b, and digital samples 117c are provided to an equalizer circuit 120. Equalizer circuit 120 applies an equalization algorithm to the respective digital samples 117a, digital samples 117b, and digital samples 117c to yield respective equalized output 122a, equalized output 122b, and equalized output 122c. In some embodiments of the present invention, equalizer circuit 120 is a digital finite impulse response filter circuit as are known in the art. In one particular case, equalizer circuit 120 includes three finite impulse response filter circuits in parallel to process respective ones of digital samples 117a, digital samples 117b, and digital samples 117c.

Equalized output 122a, equalized output 122b, equalized output 122c are provided to both data detector circuit 125 and to a sample buffer circuit 175. In some cases data detector circuit 125 includes a primary data detector circuit and a secondary data detector circuit. In such a case, the equalized outputs 122a, 122b, 122c are provided to both the secondary data detector circuit and to sample buffer circuit 175. Sample buffer circuit 175 stores the equalized outputs 122a, 122b, 122c as buffered data 177a, buffered data 177b, buffered data 177c, respectively, for use in subsequent iterations through data detector circuit 125. Data detector circuit 125 may be any data detector circuit known in the art that is capable of producing a detected output 127 from the three data streams. As some examples, data detector circuit 125 may be, but is not limited to, a Viterbi algorithm detector circuit or a maximum a posteriori detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Detected output 127 may include both hard decisions and soft decisions. The terms "hard decisions" and "soft decisions" are used in their broadest sense. In particular, "hard decisions" are outputs indicating an expected original input value (e.g., a binary '1' or '0', or a non-binary digital value), and the "soft decisions" indicate a likelihood that corresponding hard decisions are correct. Based upon the disclosure provided herein, one of ordinary skill in the art will recognize a variety of hard decisions and soft decisions that may be used in relation to different embodiments of the present invention.

Detected output 127 is provided to a central queue memory circuit 160 that operates to buffer data passed between data detector circuit 125 and data decoder circuit 150. In some cases, central queue memory circuit 160 includes interleaving (i.e., data shuffling) and de-interleaving (i.e., data un-shuffling) circuitry known in the art. When data decoder circuit 150 is available, data decoder circuit 150 accesses detected output 127 from central queue memory circuit 160 as a decoder input 156. Data decoder circuit 150 applies a data decoding algorithm to decoder input 156 in an attempt to recover originally written data. The result of the data decoding algorithm is provided as a decoded output 152. Similar to detected output 127, decoded output 152 may include both hard decisions and soft decisions. For example, data decoder circuit 150 may be any data decoder circuit known in the art that is capable of applying a decoding algorithm to a received input. Data decoder circuit 150 may be, but is not limited to, a low density parity check (LDPC) decoder circuit or a Reed Solomon decoder circuit as are known in the art. Based upon the disclosure provided herein, one of ordinary skill in the art will recognize a variety of data decoder circuits that may be used in relation to different embodiments of the present invention. Where the original data is recovered (i.e., the data decoding algorithm converges) or a timeout condition occurs (e.g., if sample buffer circuit 175 is close to getting filled up), decoded output 152 is stored to a memory included in a hard decision output circuit 180. In turn, hard decision output circuit 180 provides the converged decoded output 152 as a data output 184 to a recipient (not shown). The recipient may be, for example, an interface circuit operable to receive processed data sets. Based upon the disclosure provided herein, one of ordinary skill in the art will recognize a variety of recipients that may be used in relation to different embodiments of the present invention. Where the original data is not recovered (i.e., the data decoding algorithm failed to converge) prior to a timeout condition, decoded output 152 indicates that the data is unusable as is more specifically discussed below, and data output 184 is similarly identified as unusable.

One or more iterations through the combination of data detector circuit 125 and data decoder circuit 150 may be made in an effort to converge on the originally written data set. As mentioned above, processing through both the data detector circuit and the data decoder circuit is referred to as a "global iteration". For the first global iteration, data detector circuit 125 applies the data detection algorithm to equalized outputs 122a, 122b, 122c without guidance from a decoded output. For subsequent global iterations, data detector circuit 125 applies the data detection algorithm to buffered data 177a, 177b, 177c as guided by decoded output 152. To facilitate this guidance, decoded output 152 is stored to central queue memory circuit 160 as a decoder output 154, and is provided from central queue memory circuit 160 as a detector input 129 when equalized outputs 122a, 122b, 122c are being re-processed through data detector circuit 125.

During each global iteration it is possible for data decoder circuit 150 to make one or more local iterations including application of the data decoding algorithm to decoder input 156. For the first local iteration, data decoder circuit 150 applies the data decoder algorithm without guidance from decoded output 152. For subsequent local iterations, data decoder circuit 150 applies the data decoding algorithm to decoder input 156 as guided by a previous decoded output 152. The number of local iterations allowed may be, for example, ten. Based upon the disclosure provided herein, one of ordinary skill in the art will recognize a variety of different numbers of local iterations that may be allowed in accordance with different embodiments of the present invention. Where the number of local iterations through data decoder circuit 150 exceeds that allowed, but it is determined that at least one additional global iteration during standard processing of the data set is allowed, decoded output 152 is provided back to central queue memory circuit 160 as decoded output 154. Decoded output 154 is maintained in central queue memory circuit 160 until data detector circuit 125 becomes available to perform additional processing.

In contrast, where the number of local iterations through data decoder circuit 150 exceeds that allowed and it is determined that the allowable number of global iterations has been surpassed for the data set and/or a timeout or memory usage calls for termination of processing of the particular data set, standard processing of the data set concludes and an error is indicated. In some cases, retry processing or some offline processing may be applied to recover the otherwise unconverged data set. Based upon the disclosure provided herein, one of ordinary skill in the art will recognize a variety of non-standard processing techniques that may be applied to recover the otherwise unrecoverable data set.

Figure 1B:
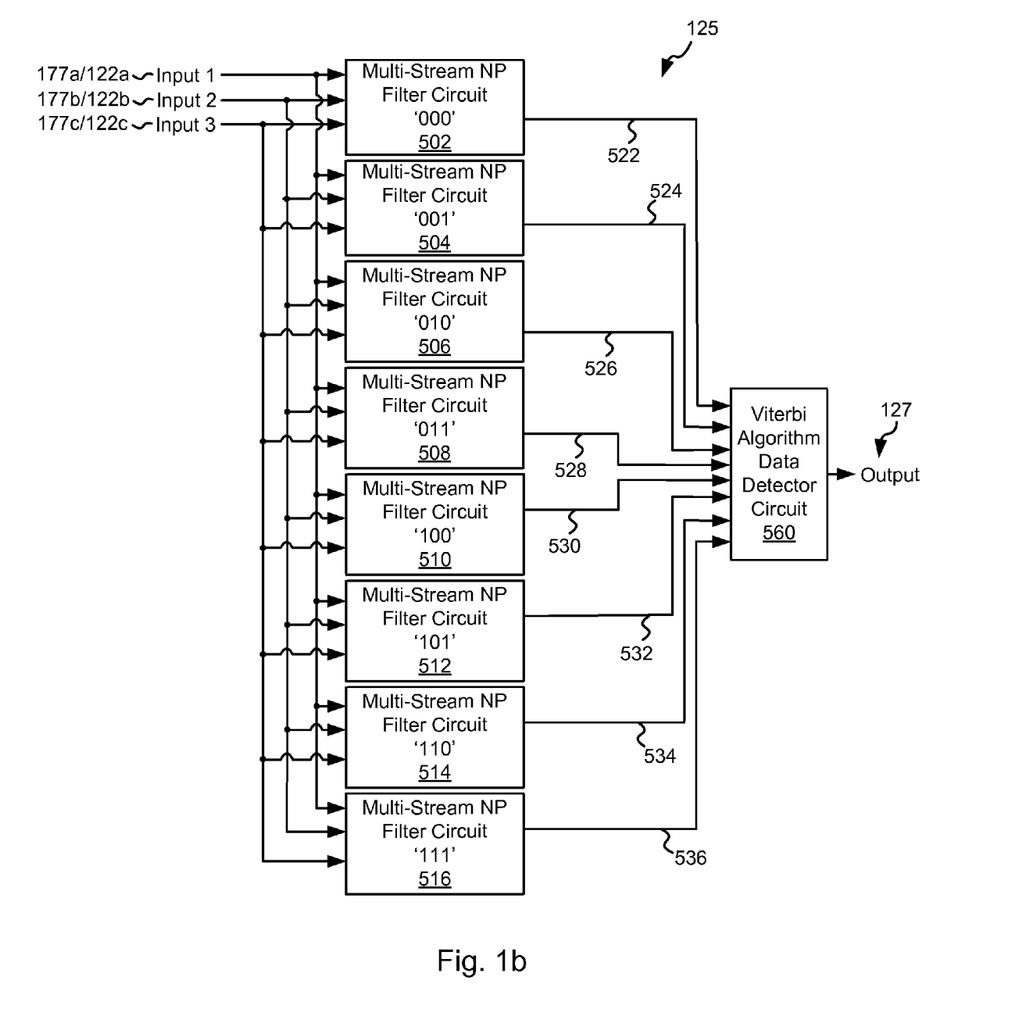

Turning to FIG. 1b, a detailed block diagram 100 of one implementation of data detector circuit 125 with multiple, multiple stream noise predictive filter circuits 502, 504, 506, 508, 510, 512, 514, 516, that each feed a respective one of branch metrics 522, 524, 526, 528, 530, 532, 534, 536 to a Viterbi algorithm data detector circuit 560. Viterbi algorithm data detector circuit 560 applies a data detection algorithm using the branch metrics 522, 524, 526, 528, 530, 532, 534, 536 to yield detected output 127. It should be noted that other implementations are possible in accordance with different embodiments of the present invention. In addition, it should be noted that Viterbi algorithm data detector circuit 560 may be replaced by another type of data detector circuit known in the art. Data detector circuit 125 includes, multiple stream noise predictive filter circuit 502 is designed to detect a '000' pattern, multiple stream noise predictive filter circuit 504 is designed to detect a '001' pattern, multiple stream noise predictive filter circuit 506 is designed to detect a '010' pattern, multiple stream noise predictive filter circuit 508 is designed to detect a '011' pattern, multiple stream noise predictive filter circuit 510 is designed to detect a '100' pattern, multiple stream noise predictive filter circuit 512 is designed to detect a '101' pattern, multiple stream noise predictive filter circuit 514 is designed to detect a '110' pattern, and multiple stream noise predictive filter circuit 516 is designed to detect a '111' pattern. An input 1 corresponds to buffered data 177a or equalized outputs 122a depending upon whether it is a first or later global iteration; an input 2 corresponds to buffered data 177b or equalized outputs 122b depending upon whether it is a first or later global iteration; and an input 3 corresponds to buffered data 177c or equalized outputs 122c depending upon whether it is a first or later global iteration.

Figure 1C:
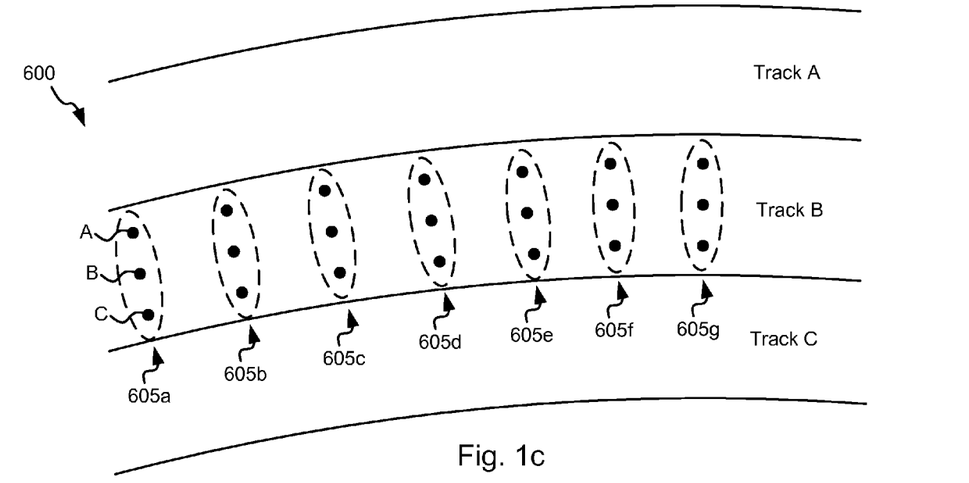

Turning to FIG. 1c, a portion of a storage medium 600 is shown that includes three tracks (Track A, Track B, Track C). A read/write head (not shown) is flying above Track B taking samples, with the sample points 605 indicated as ellipses in dashed lines. The read/write head includes three sensors. At each sample point 605, the three sensors in the read/write head each sense information at a location indicated as A, B, C, respectively along Track B. The information sensed at positions A along Track B is provided as input 1 described above in relation to FIG. 1b; the information sensed at positions B along Track B is provided as input 2 described above in relation to FIG. 1b; and the information sensed at positions C along Track B is provided as input 3 described above in relation to FIG. 1b.

Figure 1D:
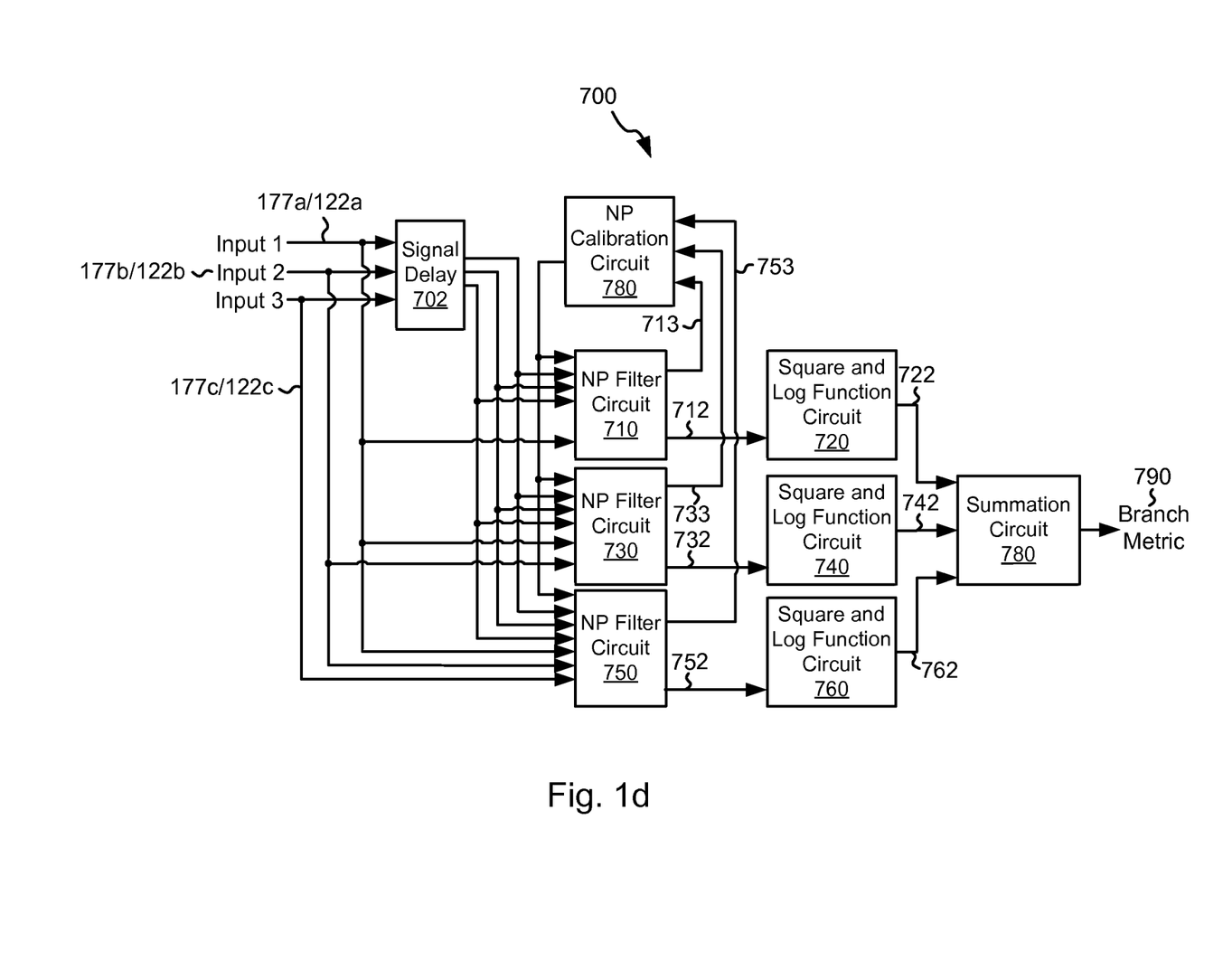

Turning to FIG. 1d, an implementation of a multi-stream noise predictive filter circuit 700 is shown in accordance with one or more embodiments of the present invention. Multi-stream noise predictive filter circuit 700 may be used in place of each of multi-stream noise predictive filters 502, 504, 506, 508, 510, 512, 514, 516 shown above in relation to FIG. 1b. As shown, multi-stream noise predictive filter circuit 700 includes a signal delay circuit 702 that delays each of input 1, input 2, and input 3 by a sample period to yield corresponding outputs input 1D, input 2D, input 3D. All of these delayed values are provided to a noise predictive filter circuit 710, a noise predictive filter circuit 730, and a noise predictive filter circuit 750. In addition, input 1 is provided to noise predictive filter circuit 710, noise predictive filter circuit 730 and noise predictive filter circuit 750; input 2 is provided to noise predictive filter circuit 730 and noise predictive filter circuit 750, and input 3 is provided to noise predictive filter circuit 750.

Noise predictive filter circuit 710 applies noise predictive filtering to the received inputs to yield a filtered output 712. The noise predictive filtering yielding filtered output 712 is described by the following equation:

$$p(e_{0,k} \mid e_{k-n}^{k-1}, \alpha_{k-m}^{k}) = \frac{1}{\sqrt{2\pi\sigma_0^2[1,2,3]}} e^{Q_0},$$

where $$Q_0 = -\frac{\left(e_{0,k} - \sum_{j=1}^{n} f_{0,j}[1,2,3]e_{0,k-1} - \sum_{j=1}^{n} f_{1,j}[1,2,3]e_{1,k-1} - \sum_{j=1}^{n} f_{2,j}[1,2,3]e_{2,k-1}\right)^2}{2\sigma_0^2[1,2,3]}.$$

In the above equation, the following equations define the values $e_{0,k}$, $e_{1,k}$, $e_{2,k}$:

$$e_{0,k} = y_{0,k} - \hat{y}_{0,k};$$

$$e_{1,k} = y_{1,k} - \hat{y}_{1,k}; \text{ and}$$

$$e_{2,k} = y_{2,k} - \hat{y}_{2,k}.$$

In this case, $y_{0,k}$, $y_{1,k}$, $y_{2,k}$ correspond to input 1, input 2, and input 3, respectively. $\hat{y}_{0,k}$, $\hat{y}_{1,k}$, $\hat{y}_{2,k}$ are the ideal outputs corresponding to $y_{0,k}$, $y_{1,k}$, $y_{2,k}$, respectively. These ideal outputs may be generated, for example, by convolving $y_{0,k}$, $y_{1,k}$, $y_{2,k}$ with target values as is known in the art. As such, the values of $e_{0,k}$, $e_{1,k}$, $e_{2,k}$ correspond to error values for each of the respective input streams. Additionally, the values of $e_{0,k-1}$, $e_{1,k-1}$, $e_{2,k-1}$ are the error values for the preceding instances of $y_{0,k}$, $y_{1,k}$, $y_{2,k}$ (i.e., $y_{0,k-1}$, $y_{1,k-1}$, $y_{2,k-1}$), respectively. The values of $f_{0,j}$, $f_{1,j}$, and $f_{2,j}$, are the filter coefficients for the noise predictive filters included in noise predictive filter circuit 710 applied to each of the respective inputs. $\sigma_0$ is the variance of input 1.

Noise predictive filter circuit 730 applies noise predictive filtering to the received inputs to yield a filtered output 732. The noise predictive filtering yielding filtered output 732 is described by the following equation:

$$p(e_{1,k} \mid e_{0,k}, e_{k-n}^{k-1}, \alpha_{k-m}^{k}) = \frac{1}{\sqrt{2\pi\sigma_1^2[1,2,3]}} e^{Q_1},$$

where $$Q_1 = -\frac{\left(e_{1,k} - \sum_{j=0}^{n} g_{0,j}[1,2,3]e_{0,k-1} - \sum_{j=1}^{n} g_{1,j}[1,2,3]e_{1,k-1} - \sum_{j=1}^{n} g_{2,j}[1,2,3]e_{2,k-1}\right)^2}{2\sigma_1^2[1,2,3]}.$$

Again, the following equations define the values $e_{0,k}$, $e_{1,k}$, $e_{2,k}$:

$$e_{0,k} = y_{0,k} - \hat{y}_{0,k};$$

$$e_{1,k} = y_{1,k} - \hat{y}_{1,k}; \text{ and}$$

$$e_{2,k} = y_{2,k} - \hat{y}_{2,k}.$$

In this case, $y_{0,k}$, $y_{1,k}$, $y_{2,k}$ correspond to input 1, input 2, and input 3, respectively. $\hat{y}_{0,k}$, $\hat{y}_{1,k}$, $\hat{y}_{2,k}$ are the ideal outputs corresponding to $y_{0,k}$, $y_{1,k}$, $y_{2,k}$, respectively. These ideal outputs may be generated, for example, by convolving $y_{0,k}$, $y_{1,k}$, $y_{2,k}$ with target values as is known in the art. As such, the values of $e_{0,k}$, $e_{1,k}$, $e_{2,k}$ correspond to error values for each of the respective input streams. Additionally, the values of $e_{0,k-1}$, $e_{1,k-1}$, $e_{2,k-1}$ are the error values for the preceding instances of $y_{0,k}$, $y_{1,k}$, $y_{2,k}$ (i.e., $y_{0,k-1}$, $y_{1,k-1}$, $y_{2,k-1}$), respectively. The values of $g_{0,j}$, $g_{1,j}$, and $g_{2,j}$ are the filter coefficients for the noise predictive filters included in noise predictive filter circuit 730 applied to each of the respective inputs. $\sigma_1$ is the variance of input 2.

Noise predictive filter circuit 750 applies noise predictive filtering to the received inputs to yield a filtered output 752. The noise predictive filtering yielding filtered output 752 is described by the following equation:

$$p(e_{2,k}|e_{1,k},e_{0,k},e_{k-n}^{k-1},\alpha_{k-m}^k) = \frac{1}{\sqrt{2\pi\sigma_2^2[1,2,3]}}e^{Q_2},$$

where $$Q_2 = -\frac{\left(e_{2,k} - \sum_{j=0}^{n}\eta_{0,j}[1,2,3]e_{0,k-1} - \sum_{j=0}^{n}\eta_{1,j}[1,2,3]e_{1,k-1} - \sum_{j=1}^{n}\eta_{2,j}[1,2,3]e_{2,k-1}\right)^2}{2\sigma_2^2[1,2,3]}.$$

Again, the following equations define the values $e_{0,k}$, $e_{1,k}$, $e_{2,k}$:

$$e_{0,k}=y_{0,k}-\hat{y}_{0,k};$$

$$e_{1,k}=y_{1,k}-\hat{y}_{1,k}; \text{ and}$$

$$e_{2,k}=y_{2,k}-\hat{y}_{2,k}.$$

In this case, $y_{0,k}$, $y_{1,k}$, $y_{2,k}$ correspond to input 1, input 2, and input 3, respectively. $\hat{y}_{0,k}$, $\hat{y}_{1,k}$, $\hat{y}_{2,k}$ are the ideal outputs corresponding to $y_{0,k}$, $y_{1,k}$, $y_{2,k}$ respectively. These ideal outputs may be generated, for example, by convolving $y_{0,k}$, $y_{1,k}$, $y_{2,k}$ with target values as is known in the art. As such, the values of $e_{0,k}$, $e_{1,k}$, $e_{2,k}$ correspond to error values for each of the respective input streams. Additionally, the values of $e_{0,k-1}$, $e_{1,k-1}$, $e_{2,k-1}$ are the error values for the preceding instances of $y_{0,k}$, $y_{1,k}$, $y_{2,k}$ (i.e., $y_{0,k-1}$, $y_{1,k-1}$, $y_{2,k-1}$), respectively. The values of $\eta_{0,j}$, $\eta_{1,j}$, and $\eta_{2,j}$ are the filter coefficients for the noise predictive filters included in noise predictive filter circuit 730 applied to each of the respective inputs. $\sigma_2$ is the variance of input 3.

Filtered output 712 is provided to a square and log function circuit 720. Square and log function circuit 720 operates to square the $Q_0$ term to yield a processed output 722 as follows: $p(e_{0,k}|e_{k-n}^{k-1},\alpha_{k-m}^k)$ term to yield:

$$\log\frac{1}{\sqrt{2\pi\sigma_2^2[1,2,3]}} + Q_0.$$

Similarly, filtered output 732 is provided to a square and log function circuit 740. Square and log function circuit 740 operates to square the $Q_1$ term and take a log of the overall $p(e_{1,k}|e_{0,k},e_{k-n}^{k-1},\alpha_{k-m}^k)$ term to yield a processed output 742 as follows:

$$\log\frac{1}{\sqrt{2\pi\sigma_2^2[1,2,3]}} + Q_1.$$

Similarly, filtered output 752 is provided to a square and log function circuit 760. Square and log function circuit 760 operates to square the $Q_2$ term and take a log of the overall $p(e_{2,k}|e_{1,k},e_{0,k},e_{k-n}^{k-1},\alpha_{k-m}^k)$ term to yield a processed output 762 as follows:

$$\log\frac{1}{\sqrt{2\pi\sigma_2^2[1,2,3]}} + Q_2.$$

Processed output 722, processed output 742 and processed output 762 are then summed using a summation circuit 780 to yield a branch metric output 790 that consists of three branch metrics, one corresponding to each of input 1, input 2, and input 3. Of note, the aforementioned process yields a branch metric based upon three different input streams that is more accurate than that achievable by averaging the three input streams, but less computational complex than doing it using matrix equations. The resulting branch metric 790 is provided to Viterbi algorithm data detector circuit that traverses a trellis based upon the three branch metrics received as part of branch metric 790. It should be noted that the same process may be expanded to four or more inputs, or two inputs depending upon the particular application.

Multi-stream noise predictive filter circuit 700 additionally includes a noise prediction calibration circuit 780. Noise prediction calibration circuit 780 operates to adaptively modify $\eta_{0,j}$, $\eta_{1,j}$, $\eta_{2,j}$, $f_{0,j}$, $f_{1,j}$, $f_{2,j}$, $g_{0,j}$, $g_{1,j}$, and $g_{2,j}$ in an attempt to reduce the value of $e_{0,k}$, $e_{1,k}$, $e_{2,k}$. In some embodiments of the present invention, the adaptive circuit is a least mean squared circuit. Upon calculation, $\eta_{0,j}$, $\eta_{1,j}$, $\eta_{2,j}$ are provided to noise predictive filter circuit 750 as part of an output 782, $f_{0,j}$, $f_{1,j}$, $f_{2,j}$ are provided to noise predictive filter circuit 710 as part of output 782, and $g_{0,j}$, $g_{1,j}$, and $g_{2,j}$ are provided to noise predictive filter circuit 730 as part of output 782.

Figure 2A:
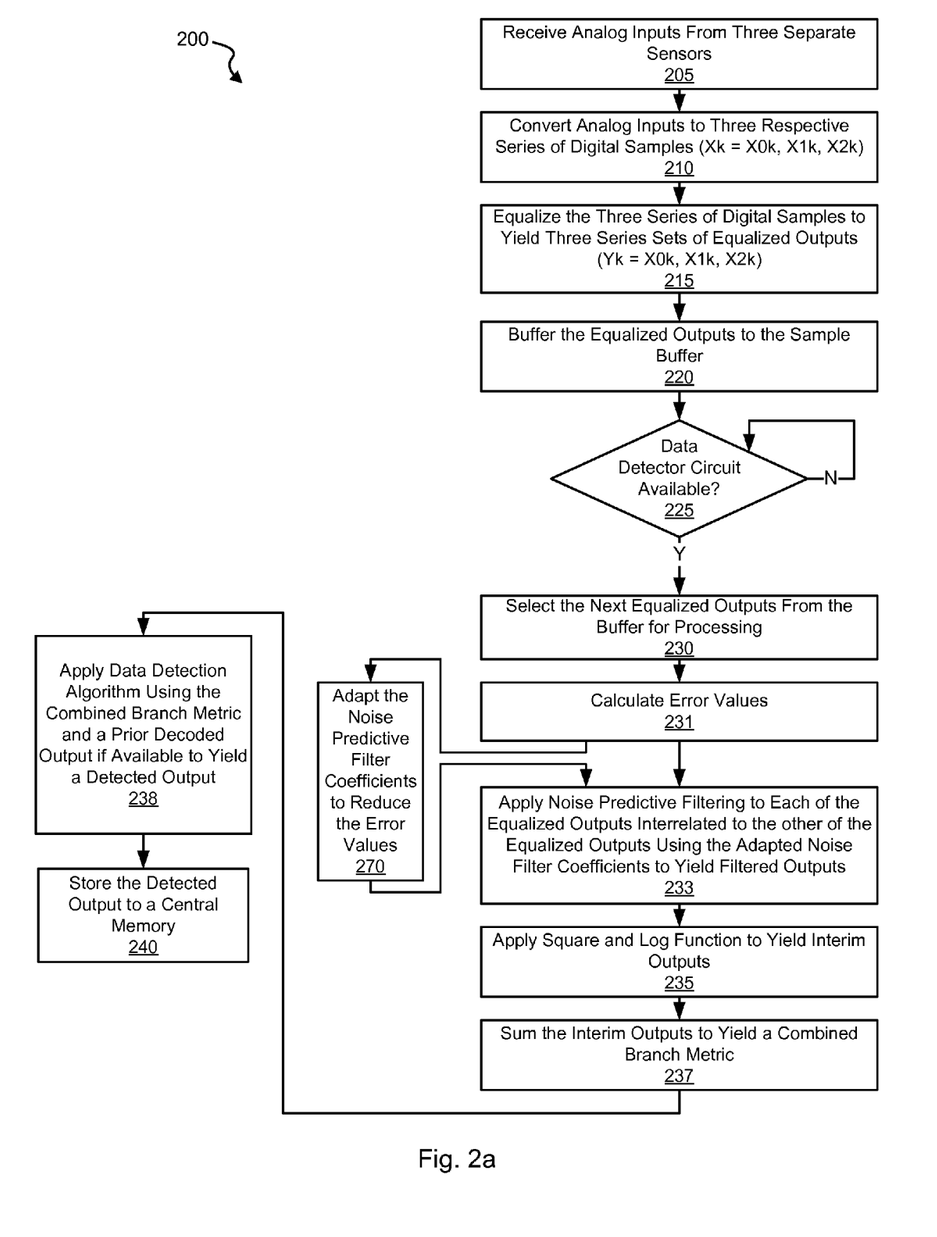
FIGS. 2a-2b are flow diagrams showing a method in accordance with some embodiments of the present invention for data processing using multiple stream noise filtering.
Figure 2B:
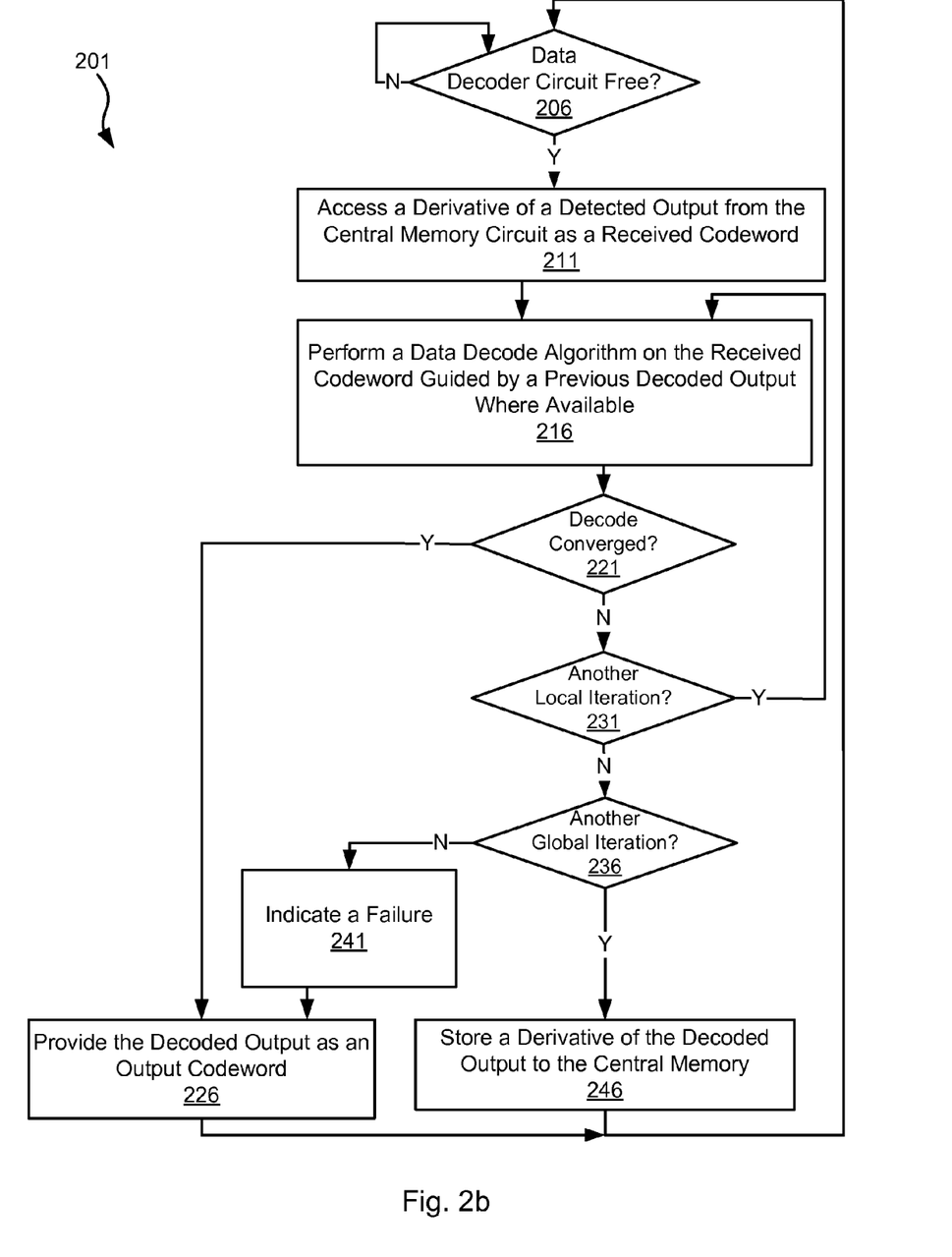

Turning to FIGS. 2a-2b, flow diagrams 200, 201 show a method in accordance with some embodiments of the present invention for data processing using multiple stream noise filtering. Following flow diagram 200 of FIG. 2a, multiple analog inputs are received for a similar location along a track (block 205). In one particular embodiment of the present invention, three sensors are used that result in three analog inputs. Each of the analog inputs are converted to a respective series of digital samples (block 210). These conversions may be done using one or more analog to digital converter circuits as are known in the art. Of note, any circuit known in the art that is capable of converting an analog signal into a series of digital values representing the received analog signal may be used. The resulting series of digital samples are equalized to yield corresponding sets of equalized outputs (block 215). In some embodiments of the present invention, the equalization is done using one or more digital finite impulse response circuits as are known in the art. Based upon the disclosure provided herein, one of ordinary skill in the art will recognize a variety of equalizer circuits that may be used in place of such a digital finite impulse response circuit to perform equalization in accordance with different embodiments of the present invention. The equalized outputs are respectively buffered is buffered (block 220).

It is determined whether a data detector circuit is available (block 225). Where the data detector circuit is available (block 225), the next equalized outputs (i.e., the equalized outputs corresponding to the multiple analog inputs) from the sample buffer are selected for processing (block 230), and error values for the equalized outputs are calculated (block 231). The error values are calculated in accordance with the following equations:

$$e_{0,k} = y_{0,k} - \hat{y}_{0,k};$$

$$e_{1,k} = y_{1,k} - \hat{y}_{1,k}; \text{ and}$$

$$e_{2,k} = y_{2,k} - \hat{y}_{2,k};$$

where $e_{0,k}$ corresponds to a first of the analog inputs, $e_{1,k}$ corresponds to a second of the analog inputs, and $e_{2,k}$ corresponds to a third of the analog inputs. $y_{0,k}$, $y_{1,k}$, $y_{2,k}$ correspond to the three equalized outputs, respectively. $\hat{y}_{0,k}$, $\hat{y}_{1,k}$, $\hat{y}_{2,k}$ are the ideal outputs corresponding to $y_{0,k}$, $y_{1,k}$, $y_{2,k}$, respectively. These ideal outputs may be generated, for example, by convolving $y_{0,k}$, $y_{1,k}$, $y_{2,k}$ with target values as is known in the art.

Noise predictive filtering is applied to each of the equalized outputs in a process that interrelates all of the equalized outputs using adapted noise filter coefficients (i.e., $\eta_{0,j}$, $\eta_{1,j}$, $\eta_{2,j}$, $f_{0,j}$, $f_{1,j}$, $f_{2,j}$, $g_{0,j}$, $g_{1,j}$, and $g_{2,j}$) to yield respective filtered outputs corresponding to each of the equalized outputs (block 233). The following equations describe the filtered outputs resulting from each of the streams:

$$\text{Filtered Output 1} = \frac{1}{\sqrt{2\pi\sigma_0^2[1,2,3]}} e^{Q_0},$$

where $$Q_0 = -\frac{\left(e_{0,k} - \sum_{j=1}^{n} f_{0,j}[1,2,3]e_{0,k-1} - \sum_{j=1}^{n} f_{1,j}[1,2,3]e_{1,k-1} - \sum_{j=1}^{n} f_{2,j}[1,2,3]e_{2,k-1}\right)^2}{2\sigma_0^2[1,2,3]},$$

and where the above equation, the values of $e_{0,k-1}$, $e_{1,k-1}$, $e_{2,k-1}$ are the error values for the preceding instances of $y_{0,k}$, $y_{1,k}$, $y_{2,k}$ (i.e., $y_{0,k-1}$, $y_{1,k-1}$, $y_{2,k-1}$), respectively, and $\sigma_0$ is the variance of the first input;

$$\text{Filtered Output 2} = \frac{1}{\sqrt{2\pi\sigma_1^2[1,2,3]}} e^{Q_1},$$

where $$Q_1 = -\frac{\left(e_{1,k} - \sum_{j=0}^{n} g_{0,j}[1,2,3]e_{0,k-1} - \sum_{j=1}^{n} g_{1,j}[1,2,3]e_{1,k-1} - \sum_{j=1}^{n} g_{2,j}[1,2,3]e_{2,k-1}\right)^2}{2\sigma_1^2[1,2,3]},$$

and where $\sigma_1$ is the variance of the first input; and $$\text{Filtered Output 3} = \frac{1}{\sqrt{2\pi\sigma_2^2[1,2,3]}} e^{Q_2},$$

where $$Q_2 = -\frac{\left(e_{2,k} - \sum_{j=0}^{n} \eta_{0,j}[1,2,3]e_{0,k-1} - \sum_{j=0}^{n} \eta_{1,j}[1,2,3]e_{1,k-1} - \sum_{j=1}^{n} \eta_{2,j}[1,2,3]e_{2,k-1}\right)^2}{2\sigma_2^2[1,2,3]},$$

and $\sigma_2$ is the variance of the third input. Noise predictive coefficients are adapted to reduce the error values (block 270), with the resulting coefficients $\eta_{0,j}$, $\eta_{1,j}$, $\eta_{2,j}$, $f_{0,j}$, $f_{2,j}$, $g_{0,j}$, $g_{1,j}$, and $g_{2,j}$ used to perform the previously described noise predictive filtering (block 233).

A square and log function is then applied to the filtered outputs to yield interim outputs (block 235). The square and log function operates to square the Q values in the above mentioned equations and taking a log of the overall equation leaving the following interim outputs:

$$\text{Interim Output 1} = \log\frac{1}{\sqrt{2\pi\sigma_2^2[1,2,3]}} + Q_0;$$

$$\text{Interim Output 2} = \log\frac{1}{\sqrt{2\pi\sigma_2^2[1,2,3]}} + Q_1;$$

and $$\text{Interim Output 3} = \log\frac{1}{\sqrt{2\pi\sigma_2^2[1,2,3]}} + Q_2$$

The aforementioned interim outputs are then summed to yield a combined branch metric accounting for the interrelationship of the three analog inputs (block 237).

The combined branch metric is then used to apply a data detection algorithm and make the most likely decision of the proper detected output corresponding to the three analog inputs (block 238). Where available, a prior decoded output corresponding to the combined branch metric is used to guide application of the data detection algorithm. The detected output is then stored to a central memory to await data decoding (block 240).

Turning to FIG. 2b and following flow diagram 201, in parallel to the previously described data detection process, it is determined whether a data decoder circuit is available (block 206). The data decoder circuit may be, for example, a low density data decoder circuit as are known in the art. Where the data decoder circuit is available (block 206), a previously stored derivative of a detected output is accessed from the central memory and used as a received codeword (block 211). A data decode algorithm is applied to the received codeword to yield a decoded output (block 216). It is then determined whether the decoded output converged (e.g., resulted in the originally written data as indicated by the lack of remaining unsatisfied checks) (block 221). Where the decoded output converged (block 221), the converged codeword is provided as a decoded output (block 226).

Alternatively, where the decoded output failed to converge (e.g., errors remain) (block 221), it is determined whether another local iteration is desired (block 231). In some cases, as a default seven local iterations are allowed per each global iteration. Based upon the disclosure provided herein, one of ordinary skill in the art will recognize another default number of local iterations that may be used in relation to different embodiments of the present invention. Where another local iteration is desired (block 231), the data decode algorithm is re-applied using the current decoded output as a guide (block 216).

Alternatively, where another local iteration is not desired (block 231), it is determined whether another global iteration is allowed (block 236). As a default, another global iteration is allowed where there is sufficient available space in the central memory and an output memory reordering queue to allow another pass through processing the currently processing codeword. The amount of available space in the central memory and an output memory reordering queue is a function of how many iterations are being used by concurrently processing codewords to converge. For more detail on the output queue time limitation see, for example, U.S. patent application Ser. No. 12/114,462 entitled "Systems and Methods for Queue Based Data Detection and Decoding", and filed May 8, 2008 by Yang et al. The entirety of the aforementioned reference is incorporated herein by reference for all purposes. Thus, the amount of time that a codeword may continue processing through global iterations is a function of the availability of central memory and an output memory reordering queue. By limiting the number of global iterations that may be performed, the amount of time a codeword may continue processing through global iterations can be reduced.

Where another global iteration is allowed (block 236), a derivative of the decoded output is stored to the central memory (block 246). The derivative of the decoded output being stored to the central memory triggers the data set ready query of block 205 to begin the data detection process. Alternatively, where another global iteration is not allowed (block 536), a failure to converge is indicated (block 241), and the current decoded output is provided (block 226).

Figure 3:
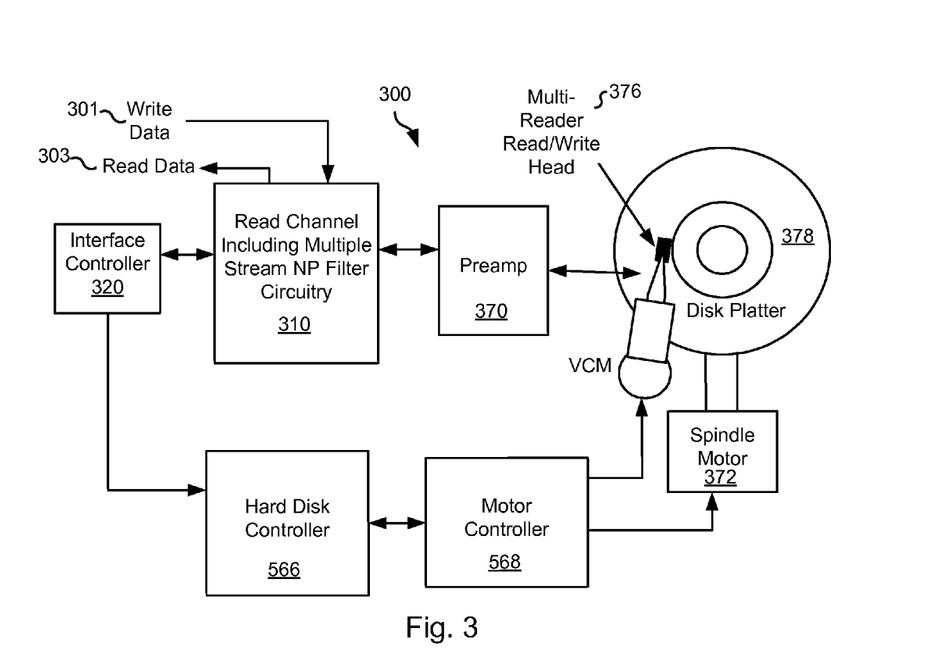
FIG. 3 shows a storage device including a read channel having multiple stream noise filtering circuitry in accordance with one or more embodiments of the present invention.

Turning to FIG. 3, a storage device 300 is shown that includes a read channel having multiple stream noise filtering circuitry in accordance with one or more embodiments of the present invention. Storage system 300 may be, for example, a hard disk drive. Storage system 300 also includes a preamplifier 370, an interface controller 320, a hard disk controller 366, a motor controller 368, a spindle motor 372, a disk platter 378, and a multi-reader read/write head assembly 376. Interface controller 320 controls addressing and timing of data to/from disk platter 378. The data on disk platter 378 consists of groups of magnetic signals that may be detected by read/write head assembly 376 when the assembly is properly positioned over disk platter 378. In one embodiment, disk platter 378 includes magnetic signals recorded in accordance with either a longitudinal or a perpendicular recording scheme.

In a typical read operation, multi-reader read/write head assembly 376 is accurately positioned by motor controller 368 over a desired data track on disk platter 378. Motor controller 368 both positions multi-reader read/write head assembly 376 in relation to disk platter 378 and drives spindle motor 372 by moving read/write head assembly to the proper data track on disk platter 378 under the direction of hard disk controller 366. Spindle motor 372 spins disk platter 378 at a determined spin rate (RPMs). Once multi-reader read/write head assembly 378 is positioned adjacent the proper data track, magnetic signals representing data on disk platter 378 are sensed at locations corresponding to each of the readers in multi-reader read/write head assembly 376 as disk platter 378 is rotated by spindle motor 372. The sensed magnetic signals are provided as multiple continuous, minute analog signals representative of the magnetic data on disk platter 378 at the locations corresponding to each of the respective readers. These minute analog signals are transferred from multi-reader read/write head assembly 376 to read channel circuit 310 via preamplifier 370. Preamplifier 370 is operable to amplify the minute analog signals accessed from disk platter 378. In turn, read channel circuit 310 decodes and digitizes the received analog signals to recreate the information originally written to disk platter 378. This data is provided as read data 303 to a receiving circuit. A write operation is substantially the opposite of the preceding read operation with write data 301 being provided to read channel circuit 310. This data is then encoded and written to disk platter 378.

During a read operation, data is sensed from disk platter 378 at multiple locations at each sample point along a give track and processed through a data processing circuit including a data detector circuit and a data decoder circuit. Convergence on the originally written data set may involve one or more global iterations through both the data detector circuit and the data decoder circuit, and one or more local iterations through the data decoder circuit for each global iteration. The data detector circuit includes one or more multi-stream noise predictive filter circuits that combine the multiple streams into interdependent branch metrics. These branch metrics are used by the data detector circuit to establish a detected output. The detected output is then processed by the decoder circuit to derive the originally written data. In some embodiments of the present invention, data processing circuits similar to that discussed above in relation to FIGS. 1*a*-1*d* may be used, and/or the processing may be done similar to that discussed above in relation to FIGS. 2*a*-2*b*.

It should be noted that storage system 300 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 300, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 310 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 300 may be modified to include solid state memory that is used to store data in addition to the storage offered by disk platter 378. This solid state memory may be used in parallel to disk platter 378 to provide additional storage. In such a case, the solid state memory receives and provides information directly to read channel circuit 310. Alternatively, the solid state memory may be used as a cache where it offers faster access time than that offered by disk platted 378. In such a case, the solid state memory may be disposed between interface controller 320 and read channel circuit 310 where it operates as a pass through to disk platter 378 when requested data is not available in the solid state memory or when the solid state memory does not have sufficient storage to hold a newly written data set. Based upon the disclosure provided herein, one of ordinary skill in the art will recognize a variety of storage systems including both disk platter 378 and a solid state memory.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
   a first multi-stream noise predictive filter circuit operable to generate a first interim output corresponding to a first data input based upon a non-matrix based combination of the first data input and a previous instance of a second data input;
   a second multi-stream noise predictive filter circuit operable to generate a second interim output corresponding to the second data input based upon a non-matrix based combination of the second data input and a previous instance of the first data input; and
   a combining circuit operable to combine at least the first interim output with the second interim output to yield a combination branch metric.

2. The data processing system of claim 1, the system further comprises:
   a data detector circuit including the first multi-stream noise predictive filter circuit and the second multi-stream noise predictive filter circuit, and operable to provide a detected output corresponding to the first data input and the second data input based at least in part on the combination branch metric.

3. The data processing system of claim 2, the system further comprising:
   a data decoder circuit operable to apply a data decode algorithm to the detected output to recover an original data set corresponding to the first data input and the second data input.

4. The data processing system of claim 3, wherein the data decode algorithm is a low density parity check algorithm.

5. The data processing system of claim 2, wherein the data detector circuit applies a Viterbi algorithm data detection.

6. The data processing system of claim 1, wherein operation of the first multi-stream noise predictive filter circuit is based at least in part on a first coefficient set, wherein operation of the second multi-stream noise predictive filter circuit is based at least in part on a second coefficient set, and wherein the system further comprises:
   a calibration circuit operable to:
      generate the first coefficient set based upon a difference between the first data input and an ideal first data input, and
      generate the second coefficient set based upon a difference between the second data input and an ideal second data input.

7. The data processing system of claim 1, wherein the combining circuit is a summation circuit operable to sum the first interim output with at least the second interim output to yield the combination branch metric.

8. The data processing system of claim 1, wherein generating the first interim output is done using a first linear computation, and wherein generating the second interim output is done using a second linear computation.

9. The data processing system of claim 1, wherein the data processing system is implemented as part of a storage device including a storage medium having at least a first track and a second track; and wherein a combination of the first data input and the second data input are selected from a group consisting of: a first data input and a second data input derived from the first track; and a first data input derived from the first track and the second data input derived from the second track.

10. The data processing system of claim 1, wherein the data processing system is implemented as part of a storage device including a storage medium having tracks, wherein the first data input corresponds to a first sample location along a particular one of the tracks, wherein the second data input corresponds to a second sample location along the particular one of the tracks, and wherein the first sample location and the second sample location are sampled at the same sample time.

11. The data processing system of claim 1, wherein the data processing system is implemented as part of an integrated circuit.

12. A method, the method comprising:
   generating a first interim output corresponding to a first data input using a first multi-stream noise predictive filter circuit based upon a non-matrix based combination of the first data input and a previous instance of a second data input;
   generating a second interim output corresponding to a second data input using a second multi-stream noise predictive filter circuit based upon a non-matrix based combination of the first data input and a previous instance of a second data input; and
   summing the first interim output with at least the second interim output to yield a combination branch metric.

13. The method of claim 12, wherein the method further comprises: applying a data detection algorithm relying on the combination branch metric to yield a detected output.

14. A storage device, the storage device comprising:
   a storage medium;
   a head assembly disposed in relation to the storage medium and operable to provide a first sensed signal and a second sensed signal corresponding to information along a track of the storage medium;
a read channel circuit including:
an analog front end circuit operable to provide a first analog signal corresponding to the first sensed signal, and a second analog signal corresponding to the second sensed signal;
an analog to digital converter circuit operable to sample the first analog signal to yield a first series of digital samples, and sample the second analog signal to yield a second series of digital samples;
an equalizer circuit operable to equalize the first series of digital samples to yield a first sample set, and equalize the second series of digital samples to yield a second sample set;
a data detector circuit including:
a first multi-stream noise predictive filter circuit operable to generate a first interim output corresponding to the first sample set based upon a non-matrix based combination of the first sample set and corresponding previous instances of the second sample set;
a second multi-stream noise predictive filter circuit operable to generate a second interim output corresponding to the second sample set based upon a non-matrix based combination of the first sample set and corresponding previous instances of the second sample set;
a combining circuit operable to combine at least the first interim output with the second interim output to yield a combination branch metric; and
operable to provide a detected output corresponding to the first data input and the second data input based at least in part on the combination branch metric.

15. The storage device of claim 14, wherein the read channel circuit further comprises:
a data decoder circuit operable to apply a data decode algorithm to the detected output to recover an original data set corresponding to the first sample set and the second sample set.

16. The storage device of claim 15, wherein the data decode algorithm is a low density parity check algorithm.

17. The storage device of claim 15, wherein the data detector circuit applies a Viterbi algorithm data detection.

18. The storage device of claim 14, wherein operation of the first multi-stream noise predictive filter circuit is based at least in part on a first coefficient set, wherein operation of the second multi-stream noise predictive filter circuit is based at least in part on a second coefficient set, and wherein the system further comprises:
a calibration circuit operable to:
generate the first coefficient set based upon a difference between the first sample set and corresponding instances of an ideal first sample set, and
generate the second coefficient set based upon a difference between the first sample set and corresponding instances of an ideal first sample set.

19. The storage device of claim 14, wherein generating the first interim output is done using a first linear computation, and wherein generating the second interim output is done using a second linear computation.

20. The storage device of claim 14, wherein the combining circuit is a summation circuit operable to sum the first interim output with at least the second interim output to yield the combination branch metric.

* * * * *